Figure 1:
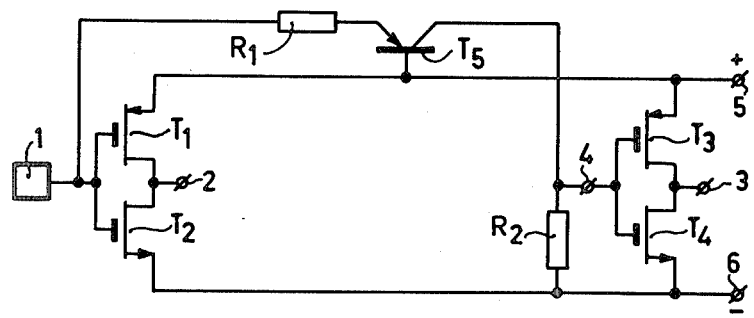

United States Patent [19]

Thommen et al.

[11] 4,229,670
[45] Oct. 21, 1980

[54] INTEGRATED CIRCUIT HAVING FIRST AND SECOND INTERNAL CIRCUITS CONTROLLED BY A COMMON INPUT TERMINAL

[75] Inventors: Werner F. Thommen, Hausen; Werner Fehr; Arpad Korom, both of Zurich, all of Switzerland

[73] Assignee: U.S. Philips Corporation, New York, N.Y.

[21] Appl. No.: 878,665

[22] Filed: Feb. 17, 1978

[30] Foreign Application Priority Data

Apr. 13, 1977 [NL] Netherlands ............... 7704005

[51] Int. Cl.² ............... H03K 5/18; H03K 3/353; H03K 19/40
[52] U.S. Cl. ................... 307/360; 307/205; 307/279; 307/361; 307/362
[58] Field of Search ............... 307/203, 205, 213, 350, 307/362, 363, 360, 304, DIG. 1, 251, 279, 361

[56] References Cited

U.S. PATENT DOCUMENTS

| | | | |
|---|---|---|---|
| 3,579,050 | 5/1971 | Basu et al. | 307/360 X |
| 3,609,411 | 9/1971 | Ma et al. | 307/360 X |
| 3,851,189 | 11/1974 | Moyer | 307/360 X |
| 3,995,171 | 11/1976 | Sonoda | 307/205 |

FOREIGN PATENT DOCUMENTS

1762940 10/1970 Fed. Rep. of Germany ........... 307/213

Primary Examiner—Larry N. Anagnos
Attorney, Agent, or Firm—Thomas A. Briody; William J. Streeter; Bernard Franzblau

[57] ABSTRACT

In order to enable two different internal circuits to be controlled from one input pin of a C-MOS IC said pin is connected directly to an input of a first circuit and via the emitter-collector path of a transistor to the input of a second circuit. The base of this transistor is connected to one of the supply voltages, so that this transistor can conduct only when the voltage on said input pin is higher or lower than the positive or negative supply voltage respectively.

13 Claims, 4 Drawing Figures

INTEGRATED CIRCUIT HAVING FIRST AND SECOND INTERNAL CIRCUITS CONTROLLED BY A COMMON INPUT TERMINAL

The invention relates to an integrated circuit comprising an input terminal for the application of signals to a first circuit, and a first and a second supply line for the supply of power to this circuit.

Such an integrated circuit may for example be an IC for controlling a clock motor, and the first circuit may for example be a circuit for adjusting the time. Furthermore, the integrated circuit in this example may comprise a plurality of frequency dividers.

It may be desirable that an IC comprises a circuit for test procedures, for example for internally bypassing a number of dividers so as to speed up the test procedure. An additional input terminal provided on the IC for this purpose is expensive and is considered an undesirable feature by users of the IC. Moreover, the risk of said test circuit being activated as a result of disturbances or defects during normal use should be minimal.

It is an object of the invention to provide an integrated circuit which enables a second circuit in the IC to be controlled from an input terminal from which the first circuit should also be controlled, without rendering the integrated circuit more susceptible to interference.

For this purpose the invention is characterized in that the integrated circuit further comprises a first transistor of which the control electrode is connected to one of said supply lines, the drain electrode (i.e. first main electrode) to the input of a second circuit which is energized between the two said supply lines, and the source electrode (i.e. second main electrode) to the said input terminal, the conductivity type of said transistor being chosen so that this transistor cannot conduct when the voltage on said input terminal lies between the voltages on said supply lines.

In this respect source, drain and control electrode is to be understood to mean those electrodes which in the case of a bipolar transistor are referred to as emitter, collector, and base respectively and in the case of a field-effect transistor as source, drain and gate respectively.

As the second circuit can only be controlled if the voltage on said input terminal exceeds one of the two supply voltages, this circuit is highly immune to interference, in particular if the two supply voltages are the only ones prevailing in the IC and in the associated circuitry of the IC during normal use of said IC. As said transistor is operated in a common control-electrode arrangement, no additional supply voltage is needed for the supply of power to the transistor. This is because the transistor then receives its power supply from the input terminal.

In an integrated circuit in accordance with the invention it is very advantageous that the first and the second circuit employ field-effect transistors on a substrate of a first conductivity type, which substrate is connected to one of said supply lines, and that the control zone of said transistor is also of this first conductivity type.

In this respect control zone is to be understood to mean the base zone of a bipolar transistor or the channel of a field-effect transistor.

As the control zone of the transistor is of the same conductivity type as the substrate, integration will be very simple. This control zone may then be constituted by the substrate and is consequently connected to a supply line via the substrate.

Said transistor can suitably be integrated in the IC in that the source electrode of said transistor is formed by a region of a second conductivity type in the substrate, and that the drain electrode is constituted by a second region of the second conductivity type surrounding the first-mentioned region.

In order to avoid parasitic effects it is then advantageous that a third region of the second conductivity type be formed in the substrate surrounding the second region, which third region is connected to one of said supply lines.

Furthermore, it is advantageous in an integrated circuits in which the first and second circuit comprise field effect transistors that the source electrode of said transistor be connected to said input terminal via a first resistor, and that via a second resistor the drain electrode be connected to that one of the two supply lines other than the one to which the control electrode is connected.

The first resistor then provides a current limiting function and the second resistor ensures that the second circuit rapidly assumes its rest condition.

This integrated circuit may be extended in such a way that a plurality of additional circuits can be controlled from the input terminal and this circuit is characterized in that the integrated circuit comprises a second transistor having a control electrode connected to one of said supply lines, the drain electrode connected to the input of a third circuit which is energized between the two said supply lines via a third resistor, and the source electrode connected to said input terminal via a fourth resistor. The conductivity type of the second transistor is such that this transistor cannot conduct when the voltage on said input terminal lies between the voltages on said supply lines.

By suitably dimensioning said resistors the activation threshold of the second circuit may be selected to differ from that of the third circuit.

In this last-mentioned integrated circuit in accordance with the invention it may be advantageous that the first and the second transistors be of opposite conductivity types, and that the base electrodes are each connected to another one of the said supply lines.

Owing to this step either the first or the second transistor can be turned on by applying a voltage to the input which is negative relative to the negative supply voltage, or positive relative to the positive supply voltage. If the two transistors were of the same conductivity type, one of the two transistors could conduct only if the other transistor were also conductive.

Figure 2:
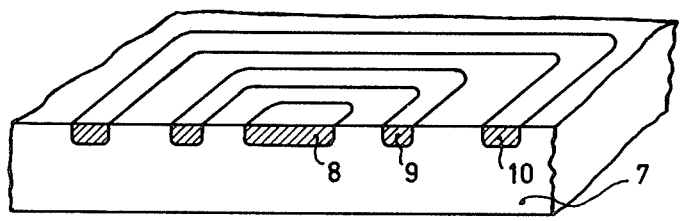
Figure 3:
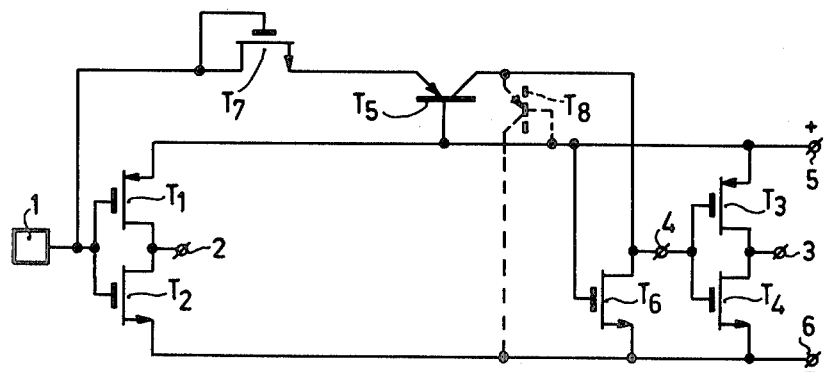
Figure 4:
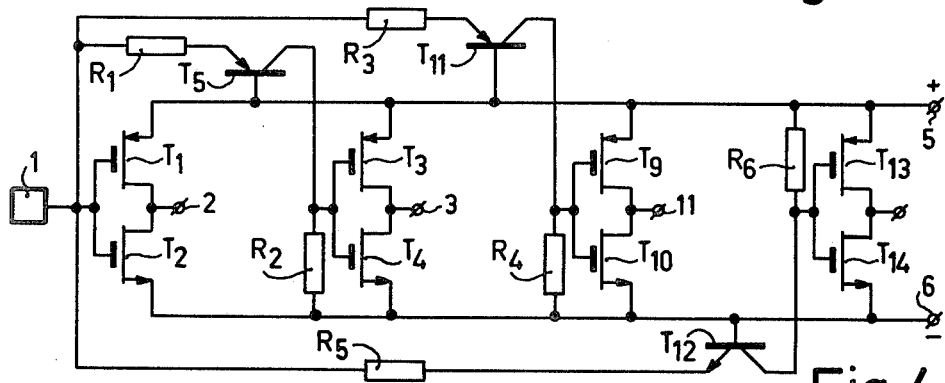

The invention will now be described in more detail with reference to the accompanying drawing, in which:

FIG. 1 shows a first embodiment of the invention,

FIG. 2 in perspective shows a cross-section of the first transistor in integrated form, FIG. 3 shows a second embodiment, and FIG. 4 shows a third embodiment.

FIG. 1 shows the circuit diagram of an integrated circuit in accordance with the invention. An input terminal 1, in particular a connection pin of the integrated circuit which includes the circuit in accordance with the invention, leads to a logic circuit for processing the signals applied to said input terminal. The logic circuit in the present example is represented by a C-MOS inverter with two mutually complementary transistors $T_1$ and $T_2$. The logic circuit is included between two supply lines 5 and 6. The integrated circuit further comprises a second circuit, which for example serves to bypass a divider stage (not shown) during test procedures. In this case this second circuit is represented as a C-MOS inverter with two mutually complementary transistors $T_3$ and $T_4$, which are also included between the supply lines 5 and 6. The circuit in accordance with the invention, which must be capable of switching said second inverter, comprises a bipolar transistor $T_5$ of the pnp-type, of which the base is connected to the positive supply line 5, the emitter to the input terminal 1 via a resistor $R_1$, and the collector to the input 4 of the second inverter and to the negative supply line 6 via a resistor $R_2$.

When signals with a voltage level between the voltages on the two supply lines 5 and 6 are applied to the input terminal 1, the second inverter $T_3$, $T_4$ cannot respond to these signals because transistor $T_5$ is then cut-off. Transistor $T_5$ can be turned on only when the voltage on input terminal 1 is higher than the voltage on the supply line 5. In that case the input voltage at which the second inverter changes over is determined by the voltage on the supply line 5, the values of the resistors $R_1$ and $R_2$, and the threshold voltage of transistor $T_4$.

Resistor $R_2$ serves to ensure that the second inverter is turned-off rapidly when transistor $T_5$ is turned off again in that its parasitic input capacitance discharges via the resistor $R_2$. Resistor $R_1$ has a current-limiting function.

Connecting the base of transistor $T_5$ to the supply line 5 has the advantage that in the IC no voltage higher than the voltage on supply line 5 need be available. This is because the circuit which includes transistor $T_5$ and resistors $R_1$ and $R_2$ is energized with a voltage appearing between the voltage on the input terminal 1 and the voltage on the supply line 6, which would not be the case if transistor $T_5$ were operated in a common-emitter arrangement.

The circuit of FIG. 1 may also be equipped with an npn-transistor $T_5$ whose base is connected to the negative supply line 6 and whose collector is connected to the positive supply line 5 via resistor $R_2$. Furthermore, versions with field-effect transistors are possible.

FIG. 2 represents transistor $T_5$ formed in an integrated circuit. This integrated circuit has an n-type substrate 7. In this substrate a p-emitter region 8 and a p-collector ring 9 are formed with diffusions, which are also used for the drain and source of the p-channel field-effect transistors. The base of transistor $T_5$ is constituted by the n-substrate 7, which is always connected to the positive supply line 5.

If the inverter $T_3$, $T_4$ is driven into full condition, transistor $T_5$ is bottomed and the collector (ring 9) functions as an emitter and emits holes into the substrate 7. These holes can be collected by an adjacent p-region of an n-channel transistor and may lead to an undesired four-layer effect (thyristor effect) via the parasitic npn-transistor associated with said n-channel transistor. This effect is prevented by providing a p-ring 10 around the collector ring 9 and connecting said ring to one of the two supply lines 5 and 6. The second ring 10 then collects the emitted holes and drains them to the power supply. This p-ring 10 can be formed by means of the diffusion steps available in the C-MOS process. Together with the substrate 7 and the collector ring 9 said p-ring 10 constitutes a parasitic npn-transistor $T_8$, which is shown dashed in FIG. 3.

In FIG. 3, which corresponds to FIG. 1, the resistors $R_1$ and $R_2$ have been replaced by field-effect transistors $T_7$ and $T_6$ which are connected as resistors.

FIG. 4 shows an extension of the circuit in accordance with FIG. 1. The circuit comprises a second pnp-transistor $T_{11}$ in which the base is connected to the positive supply line 5, the collector to the input of a third inverter $T_9$, $T_{10}$ and via a resistor $R_4$ to the negative supply line 6, and the emitter to the input terminal 1 via a resistor $R_3$.

The input voltages on terminal 1 at which the inverters $T_3$, $T_4$ and $T_9$, $T_{10}$ are switched over, are determined by the ratios of the values of the resistors $R_1$, $R_2$ and $R_3$, $R_4$ respectively. By selecting unequal ratios different circuits can be activated with different input voltages, which are higher then the voltage on the supply line 5.

Furthermore, the circuit in accordance with FIG. 4 comprises a fourth inverter $T_{13}$, $T_{14}$ having its input connected to the collector of an npn-transistor $T_{12}$. The base of this transistor is connected to the negative supply line 6, the emitter to the input terminal 1 via resistor $R_5$, and the collector to the positive supply line 5 via resistor $R_6$. This transistor $T_{12}$ can be turned on by applying a voltage to input terminal 1, which voltage is negative relative to the voltage of the negative supply line 6.

The invention is not limited to the embodiments shown. Inversion of all conductivity types is possible (npn-transistor whose base is connected to the negative supply line 6) and for transistor $T_5$ a field-effect transistor may be selected.

What is claimed is:

1. An integrated circuit comprising an input terminal for the application of signals to a first circuit, first and second supply lines for supplying power to said first circuit, a first transistor having first and second main electrodes that define a current path in the transistor and a control electrode for controlling the current flow in said transistor current path, means connecting the control electrode to one of the supply lines, the first main electrode to an input of a second circuit which is coupled between said first and second supply lines, and the second main electrode to said input terminal, the conductivity type of said transistor being such that the transistor cannot conduct when the voltage level at said input terminal lies between the voltages on said first and second supply lines.

2. An integrated circuit as claimed in claim 1 wherein the first and the second circuits comprise field-effect transistors on a substrate of a first conductivity type with the substrate connected to one of said supply lines, and wherein a control zone of said transistor is also of said first conductivity type.

3. An integrated circuit as claimed in claim 2 wherein the second main electrode comprises the source electrode of said transistor which comprises a first region of a second conductivity type in the substrate, and the first main electrode comprises the drain electrode of the transistor which comprises a second region of the second conductivity type in the substrate surrounding the first region.

4. An integrated circuit as claimed in claim 3 further comprising a third region of the second conductivity type formed in the substrate and surrounding the second region, said third region being connected to one of said supply lines.

5. An integrated circuit as claimed in claims 2, 3 or 4 wherein the second main electrode of said transistor is connected to said input terminal via a first resistor, and the first main electrode is connected to that one of the two supply lines other than the one to which the control electrode is connected via a second resistor.

6. An integrated circuit as claimed in claim 5 further comprising a second transistor having first and second main electrodes that define a current path in the transistor and a control electrode for controlling the current flow in said transistor current path, means connecting the control electrode of the second transistor to one of the said supply lines, the first main electrode to an input of a third circuit which is coupled between said first and second supply lines and via a third resistor to that one of the first and second supply lines other than the one to which the control electrode is connected, and the second main electrode to said input terminal via a fourth resistor, the conductivity type of the second transistor being such that the second transistor cannot conduct when the voltage level at said input terminal lies between the voltages on said first and second supply lines.

7. An integrated circuit as claimed in claim 6 wherein the first and the second transistors are of opposite conductivity types and the control electrodes are each connected to a different one of the said supply lines.

8. An integrated circuit comprising, an input terminal for applying signals to the integrated circuit, first and second voltage supply lines, first and second circuits coupled to said first and second supply lines to be energized thereby, first means coupling a control input to the first circuit to said input terminal, a transistor having first and second main electrodes that define a current path in the transistor and a control electrode for controlling the current flow in said transistor current path, and means connecting the control electrode to the first supply line, the first main electrode to a control input of the second circuit and the second main electrode to said input terminal, the transistor being of a conductivity type whereby it is normally cut-off so long as an input signal voltage applied to the input terminal lies in the range of voltages intermediate the voltage levels on said first and second supply lines.

9. An integrated circuit as claimed in claim 8 wherein the first and second circuits each comprise at least one field effect transistor coupled to said first and second supply lines, the integrated circuit further comprising, a third circuit including at least one field effect transistor coupled to said first and second supply lines and having a control input, a second transistor having first and second main electrodes that define a current path in the transistor and a control electrode for controlling the current flow in said transistor current path, and means connecting the control electrode of the second transistor to one of said supply lines, the first main electrode thereof to said control input of the third circuit and the second main electrode to said input terminal, the second transistor being of a conductivity type whereby it is normally cut-off so long as an input signal voltage applied to the input terminal lies in the range of voltages intermediate the voltage levels on said first and second supply lines.

10. An integrated circuit as claimed in claim 9 further comprising, a first voltage divider connected in series with the first transistor and coupled to said control input of the second circuit so as to define a first predetermined voltage threshold voltage at which the second circuit will be switched into operation, and a second voltage divider connected in series with the second transistor and coupled to said control input of the third circuit so as to define a second predetermined voltage level at which the third circuit will be switched into operation, said first and second voltage threshold levels lying outside the range of voltages defined by the voltage levels of said first and second supply lines.

11. An integrated circuit as claimed in claims 9 or 10 wherein the first and second transistors are of opposite conductivity types with each of their control electrodes connected to a different one of said supply lines.

12. An integrated circuit as claimed in claim 8 wherein said first and second supply lines comprise the sole source of electric energization of said transistor and said first and second circuits.

13. An integrated circuit as claimed in claims 8 or 12 wherein said connecting means includes a first resistor connected between the transistor second main electrode and the input terminal and a second resistor connected between the transistor first main electrode and the second supply line.

* * * * *